(12) United States Patent
Tonietto et al.

(10) Patent No.: US 6,807,225 B1
(45) Date of Patent: Oct. 19, 2004

(54) CIRCUIT AND METHOD FOR SELF TRIMMING FREQUENCY ACQUISITION

(75) Inventors: Davide Tonietto, Laguna Niguel, CA (US); Andre M. Bischof, Cham (CH)

(73) Assignee: Conexant Systems, Inc., Newport Beach, CA (US)

(*) Notice: Subject to any disclaimer, the term of this patent is extended or adjusted under 35 U.S.C. 154(b) by 879 days.

(21) Appl. No.: 09/584,598

(22) Filed: May 31, 2000

(51) Int. Cl.[7] .............................. H04B 1/38; H03D 3/24; G01R 23/02

(52) U.S. Cl. ........................... 375/219; 375/375; 327/48

(58) Field of Search ................................ 375/345, 375, 375/362; 331/17

(56) References Cited

U.S. PATENT DOCUMENTS

| | | | | |
|---|---|---|---|---|
| 4,319,200 A | * | 3/1982 | Terwilliger ..................... | 331/8 |
| 4,943,787 A | * | 7/1990 | Swapp ........................... | 331/2 |
| 4,987,387 A | * | 1/1991 | Kennedy et al. ............. | 331/1 A |
| 5,446,416 A | * | 8/1995 | Lin et al. ....................... | 331/11 |
| 5,459,753 A | * | 10/1995 | Co et al. ....................... | 375/362 |
| 5,566,204 A | * | 10/1996 | Kardontchik et al. ....... | 375/219 |
| 5,870,592 A | * | 2/1999 | Dreps et al. ................. | 713/500 |
| 5,942,949 A | * | 8/1999 | Wilson et al. ................ | 331/17 |
| 6,081,572 A | * | 6/2000 | Filip ............................ | 375/376 |
| 6,114,920 A | * | 9/2000 | Moon et al. ................. | 331/179 |
| 6,316,966 B1 | * | 11/2001 | Chang et al. .................. | 327/2 |
| 6,331,792 B1 | * | 12/2001 | Tonietto ....................... | 327/48 |

OTHER PUBLICATIONS

Musch et al., A Highly Linear Frequency Ramp Generator Based on a Fractional Divider Phase-Locked-Loop, Apr. 1999, Instrumentation and Measurement, IEEE Transaction on, vol. 48, pp. 634–637.*

Azais et al., A low-cost adaptive ramp generator for analog BIST applications, Apr. 29–May 3, 2001, VLSI Test Symposium, 19th IEEE Proceedings on, VTS 2001, pp. 266–271.*

Pottbacker et al., An 8 GHz Silicon Bipolar Clock–Recovery and Data–Regenerator IC, Solid-State Circuits Conference, Digest of Technical Papers, Feb. 16–18, 1994, 41st ISSCC., pp. 116–117.*

(List continued on next page.)

Primary Examiner—Stephen Chin
Assistant Examiner—Lawrence Williams
(74) Attorney, Agent, or Firm—Seed IP Law Group, PLLC

(57) ABSTRACT

A circuit and method is disclosed for self trimming in frequency acquisition and clock recovery. The circuit can be simplified as having a VCO in communication with three loops including a trimming loop, a frequency loop and a phase loop. The trimming loop includes a ramp generator for supplying a steady increase of bias current to the VCO causing the frequency of the VCO to increase. At each step, the averaged output of the frequency detector is measured by a comparator. A decision circuit included in the trimming loop registers the output of the comparator in digital format. The trimming loop continues until the decision circuit detects a long string of positives followed by a long string of negatives and at this point, the trimming loop is shut off and the frequency loop is in operation. The frequency loop drives the VCO frequency to within a small difference of the incoming data frequency. The phase loop cleans up the data and locks the phase.

28 Claims, 4 Drawing Sheets

OTHER PUBLICATIONS

Briggmann et al., Clock recovery circuits up to 20 Gbits/s for optical transmission systems, May 23–27, 1994, Microwave Symposium Digest, IEEE MTT–S International, vol. 2, pp. 1093–1096.*

Pottbacker, A Si Bipolar Phase and Frequency Detector IC for Clock Extraction up to 8 Gb/s Dec. 1992, pp. 1747–1751, IEEE Journal of Solid State Circuits, vol. 27, No. 12. T.H. Toifl and P. Moreira, Simple frequency detector circuit for biphase and NRZ clock recovery Oct. 1, 1998, Electronics Letters, vol. 34, No. 20.

T.H. Toifl and P. Moreira, Simple frequency detector circuit for biphase and NRZ clock recovery Oct. 1, 1998, Electronics Letters, vol. 34, No. 20.

* cited by examiner

CIRCUIT AND METHOD FOR SELF TRIMMING FREQUENCY ACQUISITION

FIELD OF THE INVENTION

The present invention relates, generally, to an improved circuit and method for frequency acquisition and, more particularly, to a self trimming circuit and method for frequency acquisition and clock recovery.

BACKGROUND OF THE INVENTION

Generally, all communication systems include a transmitter, a receiver and a communication channel. A fiber optic communication system is a lightwave system employing optical fibers as the communication medium. Optical fibers transport the optical signal (lightwave) with relatively little power loss. Power or fiber loss is largely due in part to noise or jitter in the signal. Signal noise can be caused by many different sources, such as, for example, thermal noise, shot noise and imperfect fiber.

Power loss consideration is an important design parameter. In particular, the power loss determines the repeater spacing of a long-haul lightwave system. During normal signal transmission it is necessary to periodically regenerate the optical signal with a repeater. Repeater stations include an optical receiver-transmitter pair that detects the incoming optical signal, recovers the electrical bit stream, and converts it back to an optical bit stream by modulating the transmission. The optical receiver portion typically consists of a digital optical receiver. The digital optical receiver includes a clock and data recovery (CDR) component comprising a decision circuit and a clock recovery circuit.

In a typical repeater, the decision circuit first compares the output from the channel to a threshold level at a sampling time determined by the clock-recovery circuit. Next, the decision circuit decides whether the signal corresponds to bit "1" or bit "0."

The purpose of the clock-recovery circuit is to isolate a spectral component at a frequency (f) equal to the bit rate (B) from the received signal. This component provides information about the bit slot to the decision circuit and helps to synchronize the bit sampling process. In the case of RZ (return-to-zero) format, a spectral component at f=B is present in the received signal and a narrow bandpass filter such as a surface-acoustic-wave (SAW) filter can effectively isolate this component. Clock recovery is more difficult in the case of NRZ (non-return-to-zero) format because the received signal lacks a spectral component at f=B. NRZ is the standard data format in SONET (synchronous optical network) systems and SONET is the standard for the telecommunications industry.

The CDR circuit restores and retimes the NRZ bit sequence by extracting the clock signal from the received data. Because the spectrum of a NRZ random bit sequence does not have a spectral component at the bit rate f=B, this spectral component has to be created using nonlinear signal processing. The component at f=B is generated, filtered and phase aligned to the NRZ data to yield a clock signal. In general, a phase and frequency locked loop (PFLL) is used to perform both the filtering and the phase alignment. The incoming data is resampled with a clean clock to filter, for example, jitter present on the data.

The clean clock is provided by a voltage controlled oscillator (VCO). The frequency and phase of the NRZ data controls the input voltage to the VCO in a loop configuration. The VCO frequency and phase are adjusted in response to the input NRZ data frequency and phase. Ideally, the VCO free running frequency (i.e., without control from the loop) should be as close as possible to the frequency of the incoming data. However, in an integrated CDR, the VCO free running frequency can vary considerably from the data frequency (e.g., up to a ±50% difference). In fact, the data frequency may be outside the maximum frequency tuning range of the VCO or outside the maximum range of the frequency detector. In both cases, it is very difficult for the loop configuration to effectively adjust the VCO frequency to the data frequency.

The CDR generally has two loops: a phase loop to clean up and lock the phase; and a frequency loop to adjust the VCO frequency to the incoming data frequency. Referring now to FIG. 1, an exemplary schematic of a two loop CDR of the prior art is shown. As illustrated, CDR 100 comprises a phase loop 102, a frequency loop 104, a VCO 106, and a frequency window 112. Phase loop 102 includes a phase detector 108. Phase detector 108 has a very narrow frequency range and, therefore, the VCO frequency must be close to the incoming data frequency for the phase loop to lock. Frequency loop 104 includes a frequency detector 110 having a wider frequency acquisition range than phase loop 102, typically around plus or minus twenty five percent (±25%) if working with no external reference. Frequency loop 104 receives the incoming NRZ data when the CDR system is initialized.

Frequency detector 110 can be a frequency detector (FD) such as the Pottbäcker frequency detector. Referring now to FIG. 2, the Pottbäcker FD 200 includes a phase detector (PD) 202, a quadrature phase detector (QPD) 204, a frequency detector (FD) 206, and an output 208. It should be noted that output 208 is averaged by a low pass filter 210. In fact, the output of frequency detector 110 and phase detector 108 of FIG. 1 are also averaged by low pass filter (LPF2) and (LPF1) respectively. In PD 202 and QPD 204, the VCO signal is sampled by the NRZ input signal. The two beat notes (Q1 and Q2 of FD 206) are subsequently processed in FD 206. The output 208 is the average of Q3. For a complete understanding of the Pottbäcker FD, refer to: A. Pottbäcker, U. Langmann, and H. -U. Schreiber, "An 8 Gb/s Si Bipolar Phase and Frequency Detector IC for Clock Extraction up to 8 Gb/s," IEEE J. Solid-State Circuits, vol. 27, no. 12, pp. 1747–1751, December 1992, the disclosure of which is incorporated herein by reference.

Referring again to FIG. 1, frequency detector 110 changes the frequency of VCO 106 using the incoming data frequency as the reference. The incoming data frequency is compared to the VCO frequency by frequency detector 110. If the incoming data frequency is higher than the VCO frequency, frequency detector 110 will output a positive average and the frequency of VCO 106 will be driven higher. Conversely, if the data frequency is lower than the VCO frequency, the average will be negative and the frequency of VCO 106 will be driven lower.

The change of VCO 106 frequency continues until the frequency of VCO 106 nears the incoming data frequency (e.g., typically around ±1% difference). Frequency window 112 is a counter that monitors the frequencies of loop 104 comparing the frequencies of the beat between the incoming data and the VCO, namely, the output of PD 202 or QPD 204 of FIG. 2. Once the frequencies approach an acceptably low difference, frequency window 112 sends a signal to shut off loop 104 causing a switch coupled to the input of VCO 106 to engage phase loop 102.

The frequency acquisition range of frequency detector 110 is wider than the range of phase detector 108, however the range is nonetheless limited. The VCO free running frequency must lie within approximately ±25% of the output of frequency detector 110 for loop 104 to effectively change the VCO frequency. However, in operation the difference between the VCO frequency and the bit rate (B) can be as high as ±50%.

Referring now to FIG. 3, an exemplary averaged output (e.g., output 208 after low pass filter 210) of a conventional. (e.g., Pottbäcker) frequency detector is shown. For exemplary purposes only, the frequency is illustrated as varying from zero to twice the incoming data frequency. As we know, NRZ format lacks a spectral component at f=B. As shown in, FIG. 3, a change of sign in average occurs at 2500 (2.5 GHz) representing the spectral component at f=B. Thus, 2500 is the center frequency or the desired lock point in the exemplary output of FIG. 3. Under ideal conditions, the VCO frequency will be the centered frequency and lock at the zero average point.

If the VCO free running frequency is 3000 (above the 0 average), the averaged output of the frequency detector will be set negative and the VCO frequency will be driven lower towards 2500, as expected. On the other hand, if the free running frequency is 2000 (below the 0 average), the averaged output will be set positive and the VCO frequency will be driven higher towards 2500, again as expected. However, if the free running frequency is 1000 the output is set negative and the VCO frequency will be driven lower, away from the desired center frequency (2500). Similarly, at a VCO frequency of 4000 the output is set positive and the VCO frequency will be subsequently increased away from 2500. Thus, unless the VCO is "tuned" (frequency range limited) to a frequency in the range of the desired center frequency and within the frequency detector's limited acquisition range, the frequency loop can not properly modulate the VCO and the CDR will not function. Furthermore, the VCO can lock on less dramatic spikes or drops which do not represent the center frequency.

One technique used in the industry includes an external reference clock having a nominal operating frequency at the desired clock frequency. The frequency detector receives an external reference clock, such as a crystal oscillator, instead of the incoming NRZ data. The VCO frequency is divided and compared with the crystal oscillator frequency.

The external crystal is very precise but allows little room for deviation from the desired frequency. Once the crystal frequency is chosen, the CDR circuit operates only at that bit rate and multiples of that frequency until the crystal is replaced with a different crystal at a different frequency. Thus, for variable-bit rate CDRs, the external crystal lacks the flexibility of multiple frequencies. In fact, to operate a truly variable bit rate CDR with the external crystal technique requires additional crystals which must be changed, thereby increasing the circuit process time and cost.

A second prior art technique includes a post-production trimming of the VCO frequency until the frequency is within the frequency detector's acquisition range. Fuses are burned onto each chip to trim either the bias current of the VCO or the capacitance on the VCO, depending upon the architecture of the circuit. Alternatively, each chip can be laser-trimmed by machine but this method increases production costs. Post-production trimming requires careful chip by chip processing, making this technique both expensive and time consuming.

Accordingly, there exists a need for an improved circuit and method for wide range frequency acquisition of NRZ data. More particularly, there is a need for a flexible CDR circuit that can accommodate multiple bit rates without significantly increasing production time or costs.

SUMMARY OF THE INVENTION

The present invention overcomes the problems of the prior art and provides an improved CDR circuit and method for recovering the clock from NRZ data. In particular, the present invention provides a start-up loop for self-trimming the VCO frequency. More particularly, the CDR circuit and method of a preferred embodiment tunes the VCO by sweeping the VCO frequency to detect the desired center frequency.

In a preferred embodiment, a CDR circuit comprises a conventional two loop architecture of the phase and frequency loops plus a third trimming loop. The trimming loop includes a ramp generator for modifying the VCO frequency. The VCO frequency is tuned to a workable frequency range of a conventional frequency detector with no external reference.

In one embodiment the trimming loop includes a decision circuit to monitor the averaged digital output from the frequency detector. When the output registers a long series of positives to negatives, the decision circuit generates a pulse to shut off the trimming loop. The remaining frequency and phase loops are engaged. The VCO is trimmed to within the frequency detector's acquisition range with limited expense and time.

BRIEF DESCRIPTION OF THE DRAWINGS

These and other features, aspects, and advantages of the present invention will become better understood with reference to the following description, appended claims, and accompanying drawings where:

DETAILED DESCRIPTION OF PREFERRED EMBODIMENTS

The present invention relates to an improved circuit and method for frequency acquisition and clock recovery from NRZ format data. Although the self trimming CDR may be suitable for clock recovery of NRZ data in various applications, such as wireless and xDSL, the present invention is conveniently described with reference to fiber optic communication systems.

The CDR circuit recovers the NRZ data clock, cleans it up (eliminates jitter) and retransmits the data to be received by the next regeneration station or end station. The difficulty with recovering NRZ data is that the data is devoid of frequency at the desired bit rate (f=B). The average of the output of a conventional frequency detector working without an external reference has a drop from positive to negative at a frequency corresponding to the bit rate. Unfortunately, outside a limited range of ±25% from the bit rate frequency, the average can change sign unpredictably, leading the conventional two loop CDR to false lock.

Figure 4:
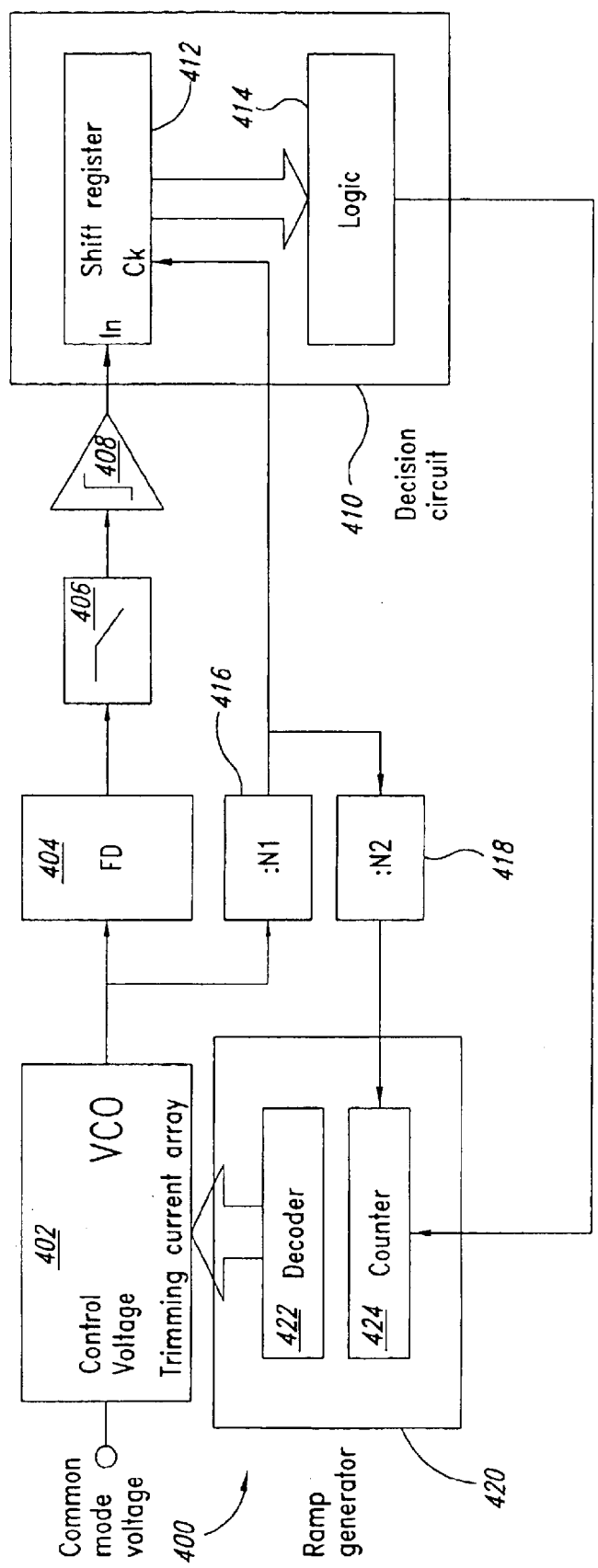
FIG. 4 illustrates in block format a self trimming loop in accordance with the present invention.

Referring now to FIG. 4, a self trimming loop circuit 400 in accordance with the present invention is shown. Self trimming loop 400 comprises a VCO 402 having two control points, a frequency detector 404, a low pass filter 406, a comparator 408, a decision circuit 410, respective frequency dividers 416 and 418, and a frequency ramp generator 420. Self trimming loop 400 is an additional loop to a conventional two loop CDR. Loop 400 is suitably configured to sweep the frequency range of the VCO and tune the VCO frequency to a workable frequency range (e.g., within ±25% of the frequency detector output) of a conventional frequency detector. Frequency detectors are well known in the industry and in a preferred embodiment, frequency detector 404 is a Pottbäcker FD as disclosed herein.

VCOs commonly have at least two control points, one for input voltage and one for trimming. In a conventional use, the VCO is typically controlled at the voltage control point. Thus, when the input voltage is increased, the frequency of the VCO is increased and vice versa. While rarely utilized by the prior art, the trimming point can also be used as a control point.

In a preferred embodiment, VCO 402 is a standard oscillator commonly known in the industry, including but not limited to a ring oscillator or an LC oscillator. The trimming point is used to control the frequency of VCO 402; consequently, the input voltage to the VCO is held constant to the voltage corresponding to the free running frequency. For the sake of brevity, the VCO described herein is with reference to a ring oscillator and the trimming is a current trimming. One of skill in the art will recognize that the present invention may be practiced in conjunction with similar oscillators without departing from the spirit of the present invention and in such cases the trimming may be different (e.g., in an LC oscillator, the capacitors are trimmed).

Ramp generator 420, comprising a digital counter 424 and a decoder 422, provides a bias current to VCO 402. A level increase of bias current at the trimming point enables the frequency of VCO 402 to increase in a step-like fashion. The present inventors have found that sweeping the VCO to eight levels of VCO frequency provides sufficient accuracy. However, it should be appreciated that any number of levels is contemplated and intended to be included within the scope of the present invention.

The frequency output of VCO 402 is scaled down with dividers (N1, N2) 416 and 418. Frequency dividers 416 and 418 reduce the frequency of VCO 402 by a predetermined amount. For example, in one exemplary embodiment, (N1) 416 and (N2) 418 are both in the range of 10 to 100, and 50 being a preferred embodiment. Thus, in a preferred embodiment, the combination of (N1=50) and (N2=50) reduces the frequency of VCO 402 by 2500 (i.e., (N1) divides the frequency by 50 then (N2) divides the output of (N1) by another 50 for a total division of 2500). Those of skill in the art will appreciate that any number of dividers or combination thereof having an "N" (division factor) may be placed in circuit 400. A particular range and preferred division factor are herein disclosed, but not intended to limit the scope of the present invention in any way.

The frequency output from the dividers is coupled to counter 424. Counter 424 counts the cycles of the clock from divider 418. The output of counter 424 is a number translated by decoder 422 into a current level to acquire eight levels of bias current, or three bits of trimming.

Figure 1:
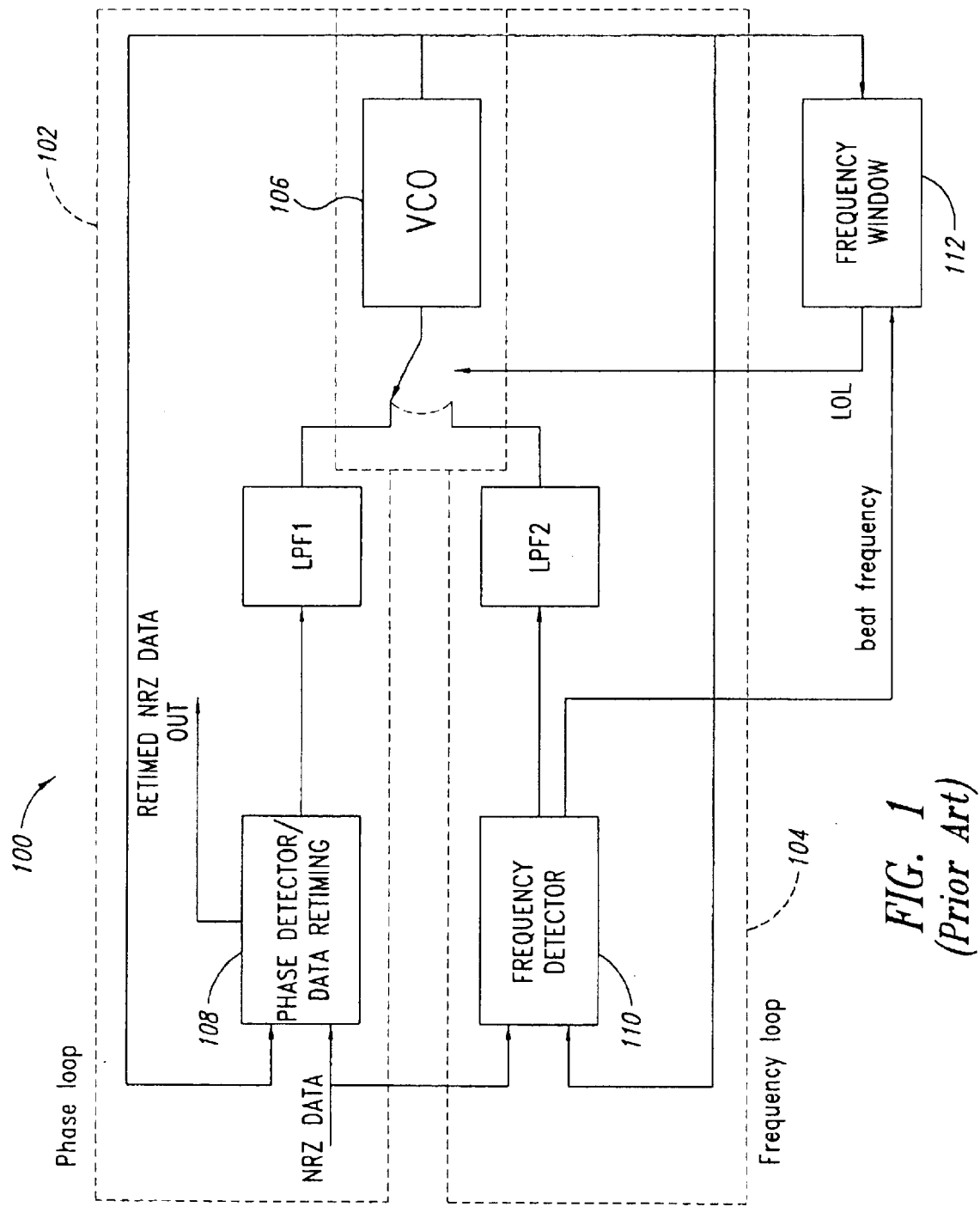
FIG. 1 illustrates in block format a two loop schematic diagram of a conventional CDR of the prior art.
Figure 2:
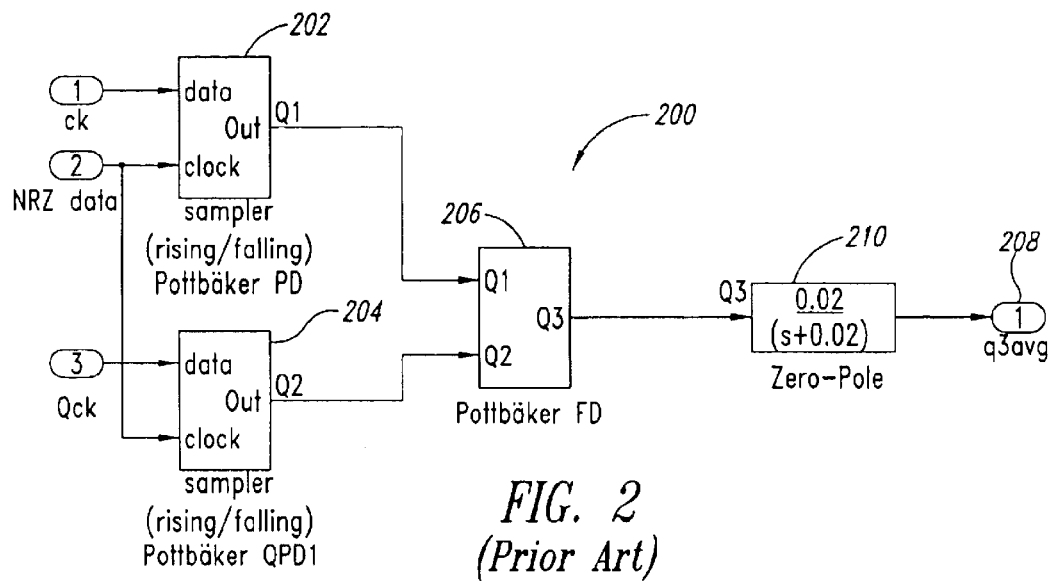
FIG. 2 illustrates in block format a Pottbäcker phase and frequency detector circuit of the prior art.
Figure 3:
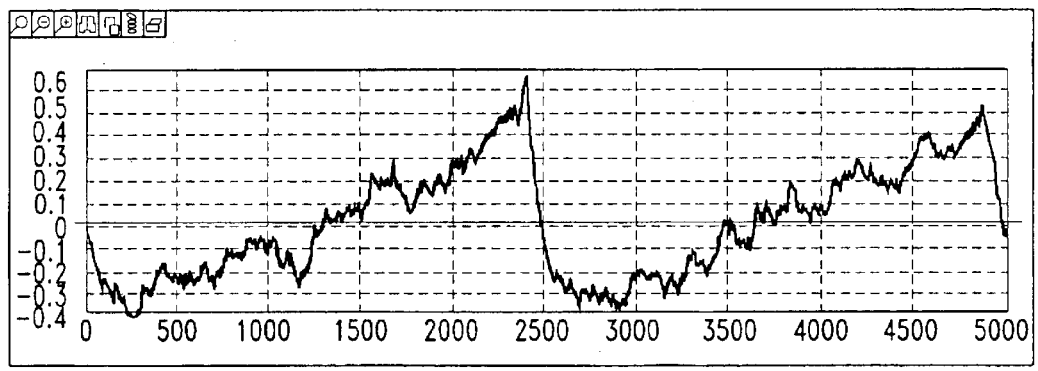
FIG. 3 illustrates an averaged frequency output from a Pottbäcker frequency detector circuit of the prior art.

At each level, the output of frequency detector 404 is averaged by low pass filter 406 and coupled to comparator 408. Comparator 408 determines if the averaged output from frequency detector 404 is positive (e.g., above the 0 line in, for example, FIG. 3) or negative (e.g., below the 0 line in, for example FIG. 3) and generates a corresponding bit.

Decision circuit 410 monitors the output of comparator 408 and includes a shift register 412 and a logic 414. Shift register 412 registers the digital output (i.e., "1" or "0") from comparator 408. Decision circuit 410 and, more particularly, shift register 412 monitors the register searching for a long sequence of "1s" (positives) and "0s" (negatives). For example, referring again to FIG. 3, the frequency output exhibits several short spikes and/or drops (e.g., at 1250, 3500, 3700 and 3750 the output displays positive to negative (drop below the 0 line) and then immediately back to positive again (jump back above the 0 line) which causes the comparator to toggle its output. Shift register 412 will not be affected by this intermittent pattern of "1s" and "0s" because this pattern does not represent a sequence of "1s" and "0s" which will trigger the decision circuit 410. However, at the center frequency (i.e., approximately 2500 on FIG. 3) there is a more significant drop in the averaged output of the frequency detector. Consequently, comparator 408 will output a series of positives just prior to the center frequency and a series of negatives just after the drop.

The ratios of the ramping speed (rate at which the ramp generator increases the VCO frequency) and the sampling speed (sampling rate of the shift register) is typically predetermined to deliver a certain number of samples for each VCO frequency step. Preferably, shift register 412 is capable of holding at least the number of samples corresponding to two steps with ten samples for each step.

Logic 414 may include, for example, AND/NOR logic and a flip flop (not shown). Decision circuit 410 and, more particularly, logic 414 generates a stop pulse when shift register 412 registers an average of approximately half zeros and half ones. Thus, once the event occurs (a long string of ones registered on one side followed by a long string of zeros registered on the other side), a stop pulse is generated by logic 414 and stored in the flip flop which is clocked by the same clock as counter 424. The flip flop remains set until a reset occurs. Thus, the state of the flip flop (set/reset) indicates whether the trimming loop is still in operation. The output of the flip flop gates off the clock of counter 424 (i.e., the bias current to VCO 402 is frozen at the current value) and trimming loop 400 is shut down.

Figure 5:
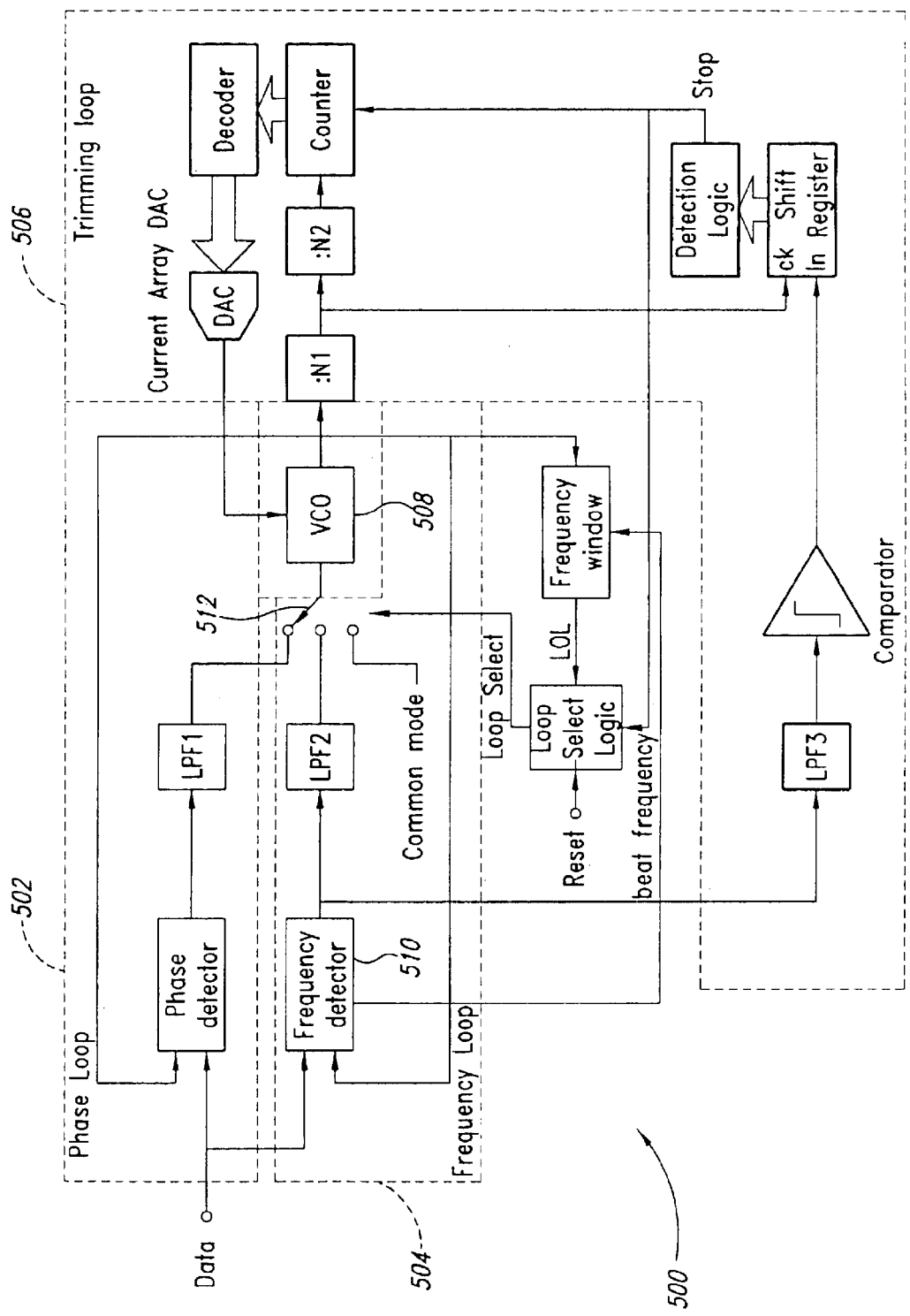
FIG. 5 illustrates in block format a three loop schematic of a CDR circuit in accordance with a preferred embodiment of the present invention.

Referring now to FIG. 5, an integrated three loop schematic of a CDR in accordance with a preferred embodiment of the present invention is shown. CDR 500 comprises a phase loop 502, a frequency loop 504, a trimming loop 506, a VCO 508 and a switch 512. Trimming loop 506 performs in a similar manner as previously disclosed, in particular trimming loop 506 divides the frequency of VCO 508 in a controlled loop fashion. The normalized frequency of VCO 508 is compared and the register begins accumulating "1s" and "0s". At the break of the series (at the "1" and "0" meeting point) lies the center frequency. False lock conditions that lie outside the detectable range of frequency detector 510 are avoided and the frequency range of VCO 508 is "tuned."

As soon as trimming loop 506 shuts itself down (i.e., the center frequency has been detected), switch 512 connects VCO 508 with frequency loop 504. Frequency loop 504 operates in substantially the same manner as previously disclosed for loop 104. In particular, frequency loop 504 drives the frequency of VCO 508 to within a small difference (e.g., typically 1000 ppm) of the incoming data frequency. Finally, switch 512 connects VCO 508 with phase loop 502. Phase loop 502 operates in substantially the same manner as previously disclosed for loop 102. In particular, phase loop 502 cleans up and locks the phase of the incoming data.

It should be appreciated that the particular implementations shown and described herein are illustrative of the invention and its best mode and are not intended to otherwise limit the scope of the present invention in any way.

The present invention has been described above with reference to preferred embodiments. However, those skilled in the art having read this disclosure will recognize that changes and modifications may be made to the preferred embodiments without departing from the scope of the present invention. These and other changes are intended to be included within the scope of the present invention, as expressed in the following claims.

What is claimed is:

1. A clock and data recovery (CDR) circuit for frequency acquisition of an incoming data signal, the circuit comprising:
    a phase loop having a phase detector, said phase loop being configured to lock a phase of the incoming data signal;
    a frequency loop having a frequency detector coupled to said phase loop and to a voltage controlled oscillator (VCO) having a frequency, said frequency loop configured to change the frequency of the VCO and to receive the incoming data signal; and
    a trimming loop coupled to said frequency detector and configured to sweep the frequency of said VCO and to trim a frequency range of said VCO, the trimming loop including a decision circuit that can detect a transition, indicative of a center frequency, between a series of consecutive positive outputs and a series of consecutive negative outputs obtained from the frequency detector and that can deactivate the trimming loop only in response to detection of the transition.

2. The circuit of claim 1 wherein said frequency detector comprises a Pottbäcker frequency detector (FD).

3. The circuit of claim 1 wherein said trimming loop includes a ramp generator to provide a bias current to said VCO.

4. The circuit of claim 1 wherein said VCO comprises a ring oscillator and said trimming loop controls said VCO through current trimming.

5. The circuit of claim 1, further comprising a ramp generator coupled to said decision circuit.

6. The circuit of claim 5 wherein said decision circuit comprises:
    a shift register to hold at least a number of samples corresponding to two steps with ten samples for each step; and
    a logic design coupled to said shift register configured to send a stop pulse to said ramp generator.

7. The circuit of claim 3 wherein said VCO comprises a ring oscillator and said ramp generator comprises a digital counter and a decoder, said ramp generator configured to increase the frequency of said VCO by increasing the bias current of said VCO.

8. The circuit of claim 6 wherein said trimming loop further comprises at least one frequency divider coupled to said VCO, said frequency divider configured to reduce the frequency of said VCO.

9. The circuit of claim 6, further comprising a comparator to receive an averaged output from said frequency detector, and to output a logic corresponding to said averaged output wherein said logic being registered in said shift register.

10. The circuit of claim 8, further comprising two frequency dividers in a range of 10 to 100.

11. The circuit of claim 8 wherein said frequency dividers equal 50.

12. The circuit of claim 5 wherein said trimming loop is configured to acquire eight levels of bias current.

13. The circuit of claim 1, further comprising a frequency window configuration to compare a beat frequency of the incoming data and a beat frequency of the VCO, said frequency window configuration operative to signal a switch coupled to the VCO to engage said frequency loop and said phase loop if said beat frequencies near an acceptable difference.

14. A method of self-trimming a voltage controlled oscillator (VCO) for frequency acquisition comprising:
    providing a loop network having a frequency detector;
    receiving a frequency stream at said frequency detector;
    comparing an averaged output from said frequency detector and generating a logic bit in response to said comparison;
    registering at a shift register said logic bit;
    controlling a frequency of the VCO via a ramp generator coupled to the VCO; and
    generating a stop pulse in response to an event occurring at said shift register, the event solely including a detected transition between a series of consecutive positive outputs and a series of consecutive negative outputs from the frequency detector that is indicative of a center frequency, said stop pulse received at said ramp generator.

15. The method of claim 14, further comprising dividing the frequency of the VCO.

16. The method of claim 14 wherein said providing comprises:
    providing a phase loop to lock a phase of the frequency stream;
    providing a frequency loop to control the frequency of the VCO; and
    providing a trimming loop to sweep the frequency of the VCO and to trim a frequency range of the VCO.

17. The method of claim 14 wherein said providing a loop network comprises providing a Pottbäcker frequency detector.

18. The method of claim 16, further comprising stopping said ramp generator control of the VCO and engaging said frequency loop and said phase loop respectively.

19. The method of claim 14 wherein said controlling comprises providing a level increase of bias current to the VCO thereby increasing the frequency of the VCO in level steps.

20. The method of claim 16, further comprising the sweeping the VCO into a plurality of levels of bias current.

21. The method of claim 20 wherein sweeping the VCO comprises sweeping the VCO into eight levels of bias current.

22. A clock and data recover CDR circuit for frequency acquisition of an incoming data signal, the circuit comprising:
    a phase loop having a phase detector, said phase loop being configured to lock a phase of the incoming data signal;

a frequency loop having a frequency detector coupled to said phase loop and to a voltage controlled oscillator (VCO) having a frequency, said frequency loop configured to change the frequency of the VCO and to receive the incoming data signal; and a trimming loop coupled to said frequency detector and configured to sweep the frequency of said VCO and to trim a frequency range of said VCO, wherein said trimming loop includes a decision circuit and a RAM generator coupled to said decision circuit, wherein said decision circuit includes:

a shift register to hold at least a number of samples corresponding to two steps with ten samples for each step; and a logic design coupled to said shift register configured to send a stop pulse to said ramp generator.

23. The circuit of claim 22 wherein said trimming loop further comprises at least one frequency divider coupled to said VCO, said frequency divider configured to reduce the frequency of said VCO.

24. The circuit of claim 22, further comprising a comparator to receive an averaged output from said frequency detector, and to output a logic corresponding to said averaged output wherein said logic being registered in said shift register.

25. A clock and data recovery (CDR) circuit for frequency acquisition of an incoming data signal, the circuit comprising:

a phase loop having a phase detector, said phase loop being configured to lock a phase of the incoming data signal;

a frequency loop having a frequency detector coupled to said phase loop and to a voltage controlled oscillator (VCO) having a frequency, said frequency loop configured to change the frequency of the VCO and to receive the incoming data signal; and a trimming loop coupled to said frequency detector and configured to sweep the frequency of said VCO and to trim a frequency range of said VCO, wherein said trimming loop includes a ramp generator to provide a bias current to said VCO, wherein said VCO comprises a ring oscillator and said ramp generator comprises a digital counter and a decoder, said ramp generator configured to increase the frequency of said VCO by increasing the bias current of said VCO.

26. A clock and data recovery (CDR) circuit for frequency acquisition of an incoming data signal, the circuit comprising:

a phase loop having a phase detector, said phase loop being configured to lock a phase of the incoming data signal;

a frequency loop having a frequency detector coupled to said phase loop and to a voltage controlled oscillator (VCO) having a frequency, said frequency loop configured to change the frequency of the VCO and to receive the incoming data signal; and a trimming loop coupled to said frequency detector and configured to sweep the frequency of said VCO and to trim a frequency range of said VCO, further comprising a frequency window configuration to compare a beat frequency of the incoming data and a beat frequency of the VCO, said frequency window configuration operative to signal a switch coupled to the VCO to engage said frequency loop and said phase loop if said beat frequencies near an acceptable difference.

27. The circuit of claim 1 wherein the decision circuit includes logic to deactivate the trimming loop in response to the transition, between an approximately equal number of consecutive positive outputs and number of consecutive negative outputs.

28. The method of claim 14 wherein the detected transition comprises a detected transition between an approximately equal number of consecutive positive outputs and number of consecutive negative outputs.

* * * * *

UNITED STATES PATENT AND TRADEMARK OFFICE
CERTIFICATE OF CORRECTION

PATENT NO. : 6,807,225 B1
DATED : October 19, 2004
INVENTOR(S) : Davide Tonietto et al.

It is certified that error appears in the above-identified patent and that said Letters Patent is hereby corrected as shown below:

Column 8,
Line 57, "comprising the sweeping" should read as -- comprising sweeping --.

Signed and Sealed this

Sixth Day of September, 2005

JON W. DUDAS
*Director of the United States Patent and Trademark Office*